(12) United States Patent
Sun

(10) Patent No.: US 6,389,095 B1
(45) Date of Patent: May 14, 2002

(54) DIVIDE-BY-THREE CIRCUIT

(75) Inventor: Bo Sun, Carlsbad, CA (US)

(73) Assignee: Qualcomm, Incorporated, San Diego, CA (US)

( * ) Notice: Subject to any disclaimer, the term of this patent is extended or adjusted under 35 U.S.C. 154(b) by 10 days.

(21) Appl. No.: 09/699,234

(22) Filed: Oct. 27, 2000

(51) Int. Cl.$^7$ .............................................. H03K 21/00
(52) U.S. Cl. ........................... 377/48; 377/47; 327/115
(58) Field of Search ..................... 377/47, 48; 327/113, 327/115, 114, 117

(56) References Cited

U.S. PATENT DOCUMENTS

| | | | |
|---|---|---|---|
| 4,315,166 A | 2/1982 | Hughes | 307/225 |
| 4,348,640 A | 9/1982 | Clendening | 328/41 |
| 4,366,394 A | 12/1982 | Clendening et al. | 307/225 |
| 4,807,266 A | 2/1989 | Taylor | 377/48 |
| 5,552,732 A | * 9/1996 | Huang | 327/116 |
| 6,157,693 A | * 12/2000 | Jayaraman | 377/47 |

FOREIGN PATENT DOCUMENTS

JP              63-76617        *  4/1988

* cited by examiner

Primary Examiner—Tuan T. Lam
(74) Attorney, Agent, or Firm—Philip R. Wadsworth; Charles D. Brown; Howard Seo

(57) ABSTRACT

An in-phase clock signal CLK_I drives a first pair of connected data flip-flops (DFFs) (302) and (308), with feedback through a NOR gate (310) and output through an in-phase OR gate (320). The output signal OUT_I is a clock signal with a third of the frequency of CLK_I. A quadrature-phase clock signal CLK_Q drives a second pair of (DFFs) (504) and (506), with output through a quadrature OR gate (508). The output signal OUT_Q is a clock signal with a third of the frequency of CLK_Q, and in quadrature with OUT_I.

2 Claims, 5 Drawing Sheets

DIVIDE-BY-THREE CIRCUIT

BACKGROUND OF THE INVENTION

1. Technical Field

This invention relates to clock circuits, and has particular relation to circuits for producing an output clock signal (preferably in-phase and quadrature) which is one-third the frequency of an input clock signal.

2. Background Art

Modern digital equipment is clocked at increasingly fast speeds. At the same time, it is often necessary to clock some equipment at a clock frequency which is only a third of the frequency of an available signal. Three is not a power of two, and most digital architecture involves powers of two, so this is not a trivial exercise.

The following United States patents have addressed divide-by-three circuits:

| Inventor | U.S. Pat. No. | Issue Date |
| --- | --- | --- |
| Hughes | 4,315,166 | February 9, 1982 |
| Clendening | 4,348,640 | September 7, 1982 |
| Clendening et al. | 4,366,394 | December 28, 1982 |
| Taylor | 4,807,266 | February 21, 1989 |

SUMMARY OF THE INVENTION

An apparatus is disclosed which provides divide-by-three capabilities using only two data flip-flops (DFFs), a NOR gate, and an OR gate. If the input clock signal is bi-phase (both in-phase and quadrature), bi-phase capabilities can be added with only two more DFFs and one more OR gate.

In its broadest aspect, an in-phase divide-by-three circuit comprises:

(a) a first data flip-flop (DFF) connected to receive, at a clock input, an in-phase input clock signal having an input frequency;

(b) a second DFF connected to receive:
   (1) at a clock input, the in-phase input clock signal; and
   (2) at a data input, a slave output from the first DFF;

(c) a NOR gate, connected:
   (1) to receive:
       (A) the slave output signal from the first DFF; and
       (B) a slave output signal from the second DFF; and
   (2) to apply a NOR output signal to a data input of the first DPF; and (d) an OR gate, connected to receive:
   (1) the slave output signal from the first DFF; and
   (2) a master output signal from the second DFF;

whereby an output of the in-phase OR gate produces an output in-phase clock signal having an output frequency equal to one third of the input frequency.

DETAILED DESCRIPTION OF THE PREFERRED EMBODIMENTS

Figure 1:
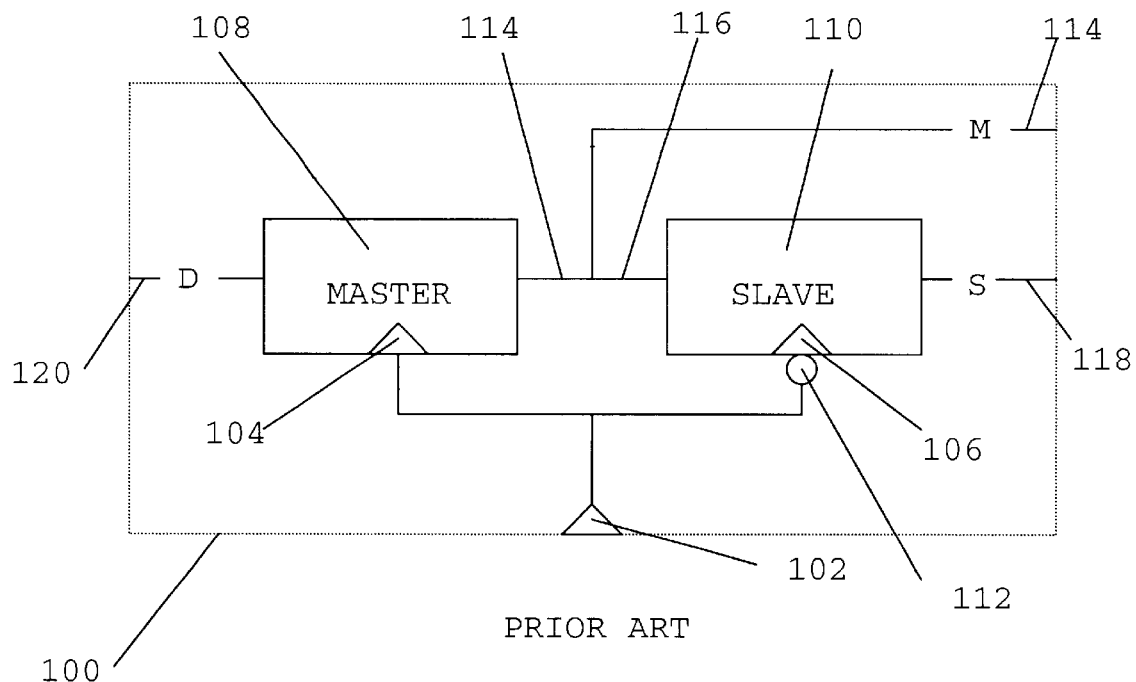
FIG. 1 shows a conventional data flip-flop (DFF) 100.

FIG. 1 shows a conventional data flip-flop (DFF) 100. A clock input 102 drives respective clock inputs 104 and 106 of a master flip-flop 108 and a slave flip-flop 110. Signal to the slave clock input 106 first pass through an inverter 112. The master output 114 drives the slave data input 116. The master output 114 and slave output 118 are the outputs of the DFF 100. The master data input 120 is the data input of the DFF 100.

Figure 2:
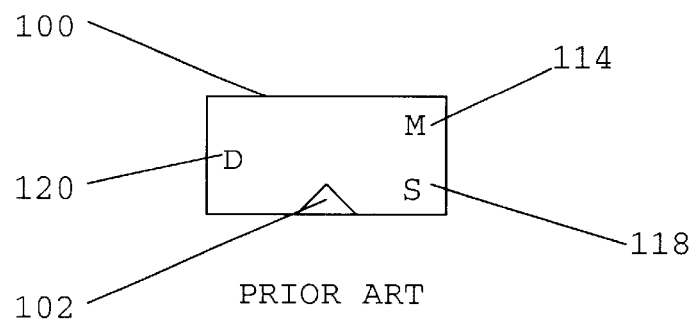
FIG. 2 shows the data flip-flop (DFF) 100, but without its internal structure.

FIG. 2 shows the data flip-flop (DFF) 100, but without its internal structure.

Figure 3:
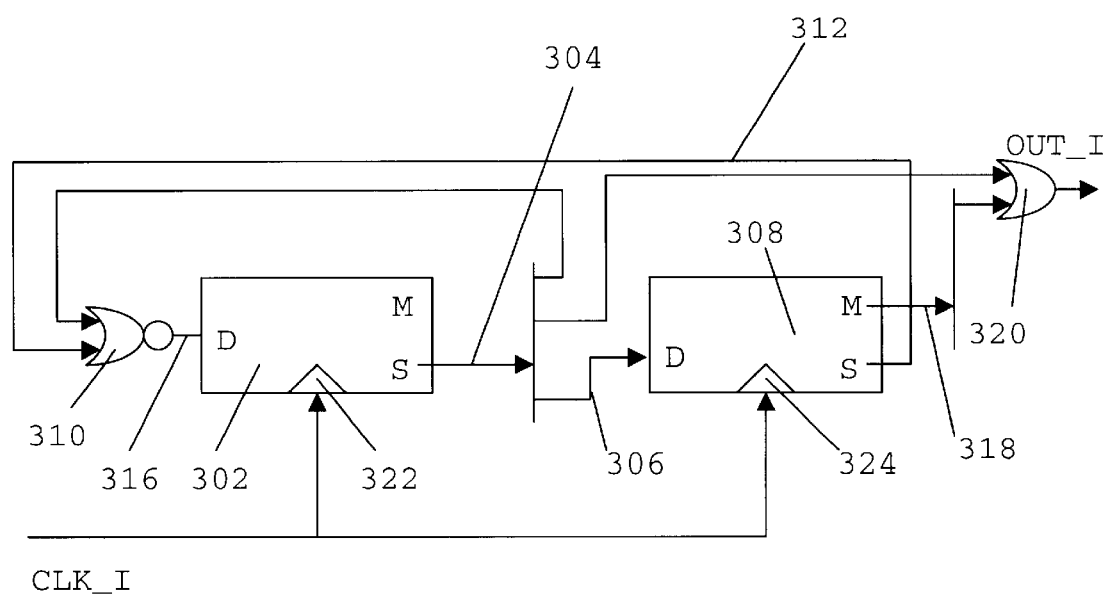
FIG. 3 shows a single-phase (in-phase) embodiment of a divide-by-three circuit 300.

FIG. 3 shows a single-phase (in-phase) embodiment of a divide-by-three circuit 300. A first data flip-flop (DFF) 302 has a first slave output 304 which drives the data input 306 of a second DFF 308.

The first slave output 304 is also one input of a NOR gate 310. The other input of the NOR gate 310 is the second slave output 312 of second DFF 308. The output of the NOR gate 310 is applied to the first data input 316 of first DFF 302.

The second master output 318 of the second DFF 308 is one input of an in-phase OR gate 320. The other input of the in-phase OR gate 320 is the first slave output 304. The in-phase output signal OUT_I of the in-phase OR gate 320 is the output of the divide-by-three circuit 300. When an in-phase clock signal CLK_I is applied to the clock inputs 322 and 324 of the first and second DFFs, respectively, the in-phase output signal OUT_I will be a clock signal with one-third the frequency of the in-phase clock signal CLK_I. Importantly, the input and output signals will be synchronized, that is, every transition in the output signal will take place at a transition of the input signal.

The single-phase divide-by-three circuit 300 is astonishingly simple. It has only four parts: first DFF 302, second DFF 308, NOR gate 310, and OR gate 320. Such a low parts count promotes reliability, economy, and ease of manufacture.

Figure 4:
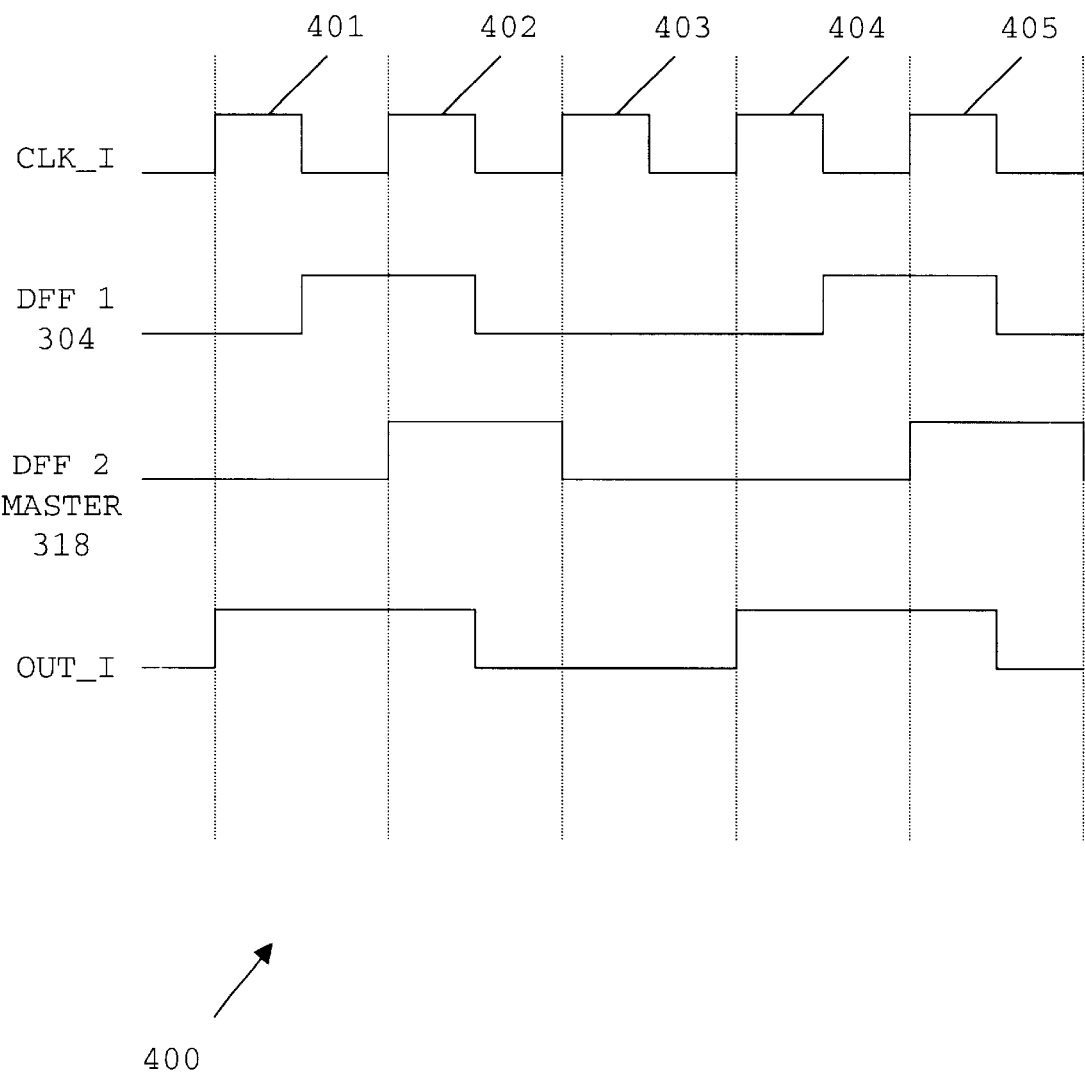
FIG. 4 is a timing diagram 400 of the divide-by-three circuit of FIG. 3.

FIG. 4 is a timing diagram 400 of the divide-by-three circuit of FIG. 3. At the falling edge of first pulse 401 of in-phase clock signal CLK_I, the output 304 of first DFF 302 goes high. This drives the data input 306 of the second DFF 308, which causes its master output 318 to go high at the next transition, namely, the rising edge of second pulse 402. Feedback to the data input 316 of first DFF 302, however, causes it to drop at the next transition, the falling edge of pulse 402. This in turn causes second master output 318 to fall a half-pulse later, the rising edge of third pulse 403.

This process continues for three complete pulses (falling edge of first pulse 401 to falling edge of fourth pulse 404), with each DFF's output being high for one complete pulse and low for two complete pulses. However, the outputs are a half-pulse out of phase. When they are ORed together by OR gate 320, the final output OUT_I is high for exactly one-and-a-half pulses and low for exactly one-and-a-half pulses. Thus, OUT_I is a dock signal with a 50% duty cycle, and with a third of the frequency of CLK_I, as is desired.

Figure 5:
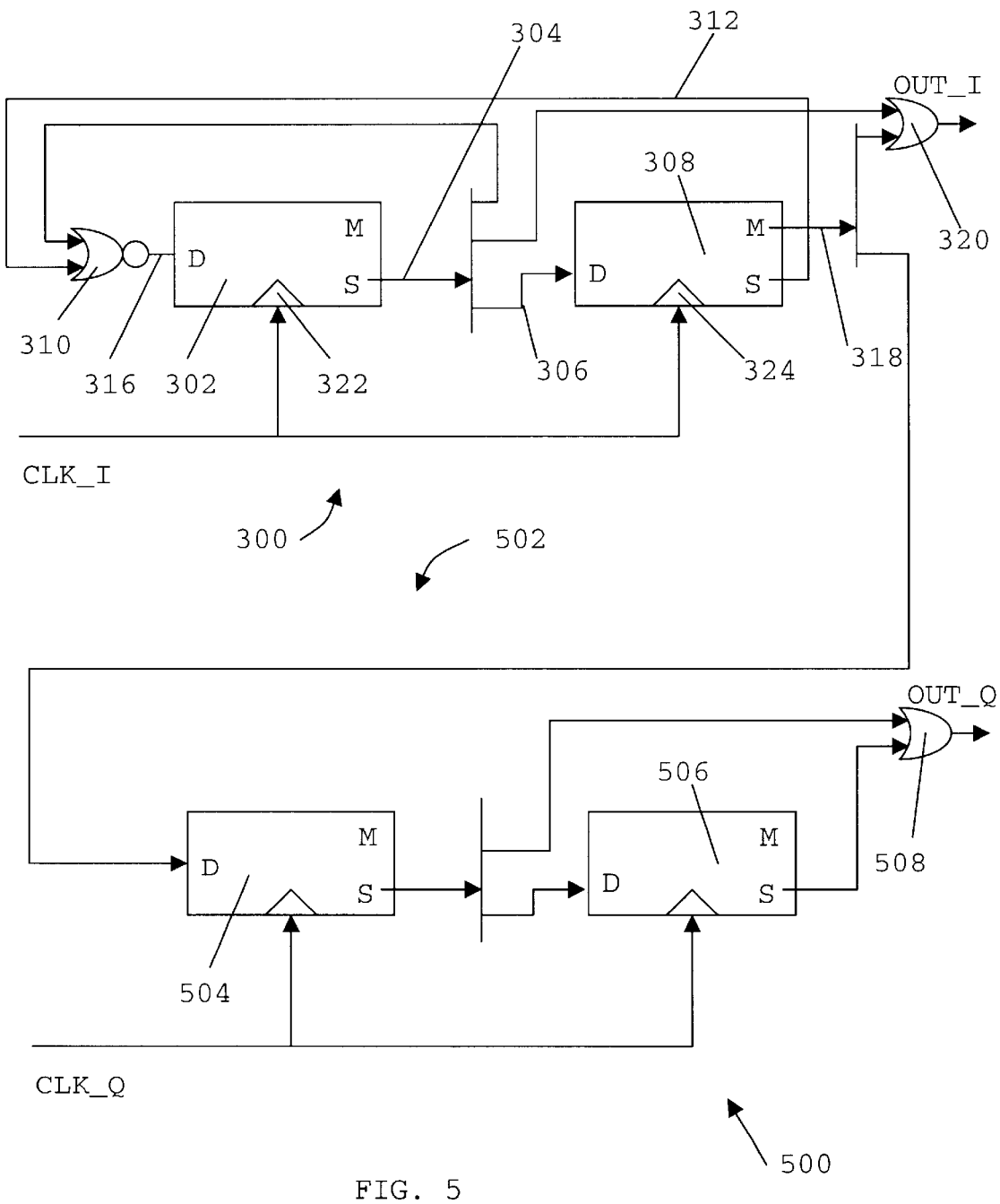
FIG. 5 shows a bi-phase (in-phase and quadrature-phase) embodiment of a divide-by-three circuit 500.

FIG. 5 shows a bi-phase (in-phase and quadrature-phase) embodiment of a divide-by-three circuit 500. The in-phase portion 300 is identical to the circuit shown in FIG. 3. The quadrature-phase portion 502 is similar, in that it also includes two data flip-flops (DFFs), but has several important differences.

First, the third DFF 504 and fourth DFF 506, which form the core of the quadrature-phase portion 502, are clocked by a quadrature clock signal CLK_Q rather than by the in-phase dock signal CLK_I.

Second, while the output signal OUT_Q is produced by a quadrature OR gate 508, the inputs to quadrature OR gate 508 are the slave output signals of the third and fourth DFFs 504 and 506. It will be noted that, in the in-phase portion 300, only the first DFF 302 has its slave output signal 304 drive the in-phase OR gate 320. The other input to the in-phase OR gate 320 is an output of the second DFF 308, but it is the master output 318, and not the slave output 312.

Third, the third DFF 504 is not driven by a NOR gate, but by the master output 318 of the second DFF 308.

The bi-phase divide-by-three circuit 500 is even more astonishingly simple than the single-phase divide-by-three circuit 300. It has only three additional parts: third DFF 504, fourth DFF 506, and quadrature OR gate 508. Even though the number of phases has been doubled, from one to two, the number of parts has less than doubled.

Figure 6:
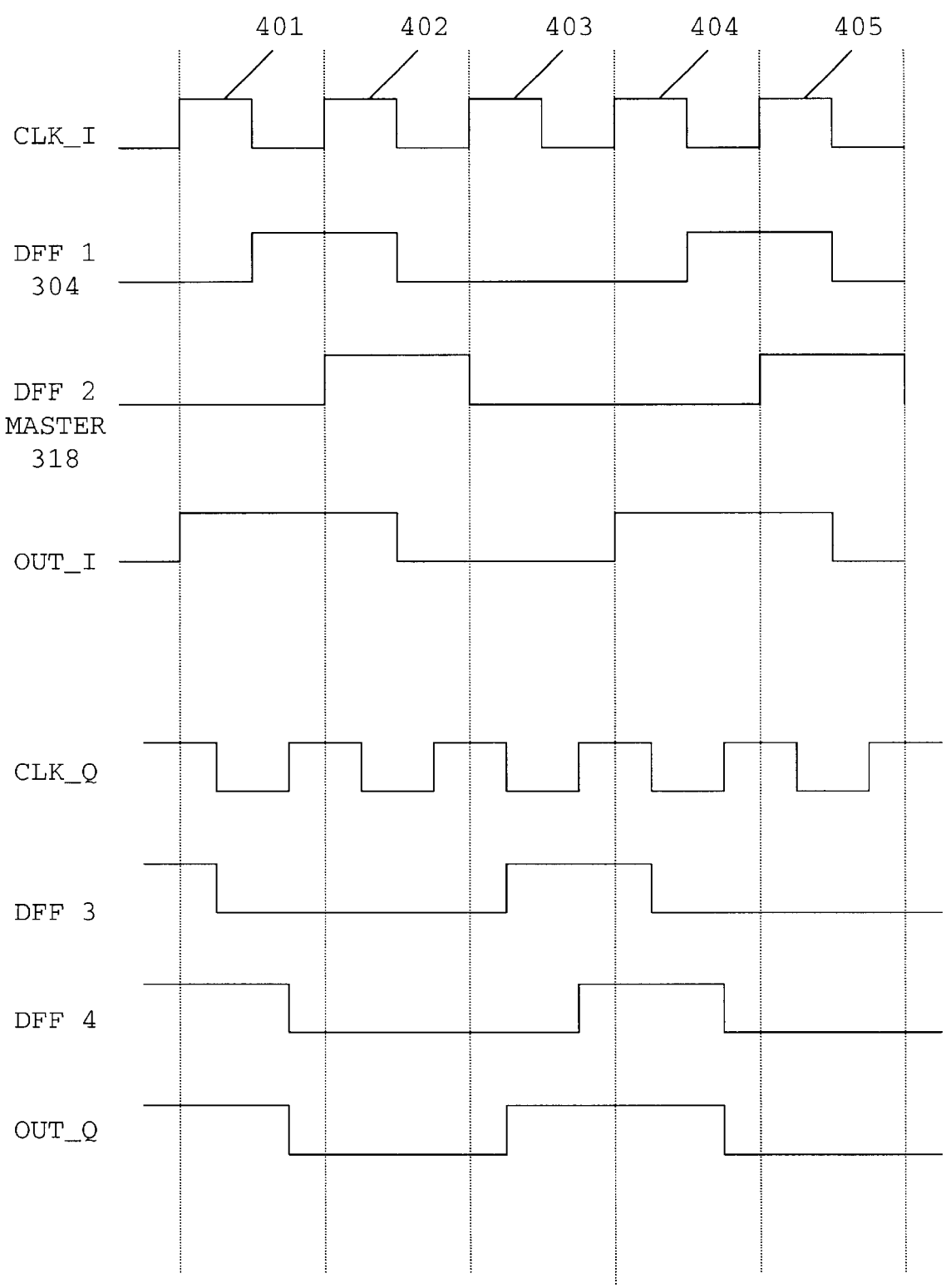
FIG. 6 is a timing diagram of the circuit 500 of FIG. 5.

FIG. 6 is a timing diagram of the circuit 500 of FIG. 5. The outputs of third and fourth data flip-flops (DFFs) 504 and 506 are similar to those of first and second data flip-flops (DFFs) 302 and 308. They are similarly combined into a quadrature output signal OUT_Q. It will be noted that OUT_Q is a clock signal with a 50% duty cycle, and with a third of the frequency of CLK_Q, as is desired. It will further be noted that OUT_Q is in quadrature with OUT_I, and that each transition of OUT_Q takes place at a transition of CLK_Q.

INDUSTRIAL APPLICATION

This invention is capable of exploitation in industry, and can be made and used, whenever is it desired to divide the frequency of a clock by three. The individual components of the apparatus and method shown herein, taken separate and apart from one another, may be entirely conventional, it being their combination that is claimed as the invention:

While various modes of apparatus and method have been described, the true spirit and scope of the invention are not limited thereto, but are limited only by the following claims and their equivalents, and such are claimed as the invention.

What is claimed is:

1. An in-phase divide-by-three circuit, characterized in that it comprises:
   (a) a first data flip-flop (DFF) connected to receive, at a clock input, an in-phase input clock signal having an input frequency;
   (b) a second DFF connected to receive:
      (1) at a clock input, the in-phase input clock signal; and
      (2) at a data input, a slave output from the first DFF;
   (c) a NOR gate, connected:
      (1) to receive:
         (A) the slave output signal from the first DFF; and
         (B) a slave output signal from the second DFF; and
      (2) to apply a NOR output signal to a data input of the first DFF; and
   (d) an in-phase OR gate, connected to receive:
      (1) the slave output signal from the first DFF; and
      (2) a master output signal from the second DFF;
   whereby an output of the in-phase OR gate produces an output in-phase clock signal having an output frequency equal to one third of the input frequency.

2. A bi-phase divide-by-three circuit, characterized in that it comprises:
   (a) the in-phase divide-by-three circuit of claim 1; and
   (b) a quadrature-phase divide-by-three circuit comprising:
      (1) a third data flip-flop (DFF) connected to receive:
         (A) at a clock input, a quadrature-phase input clock signal having the input frequency; and
         (B) at a data input, the master output signal from the second DFF;
      (2) a fourth DFF connected to receive:
         (A) at a clock input, the quadrature-phase input clock signal; and
         (B) at a data input, a slave output from the third DFF;
   (c) a quadrature OR gate, connected to receive:
      (1) a slave output signal from the third DFF; and
      (2) a slave output signal from the fourth DFF;
   whereby an output of the quadrature OR gate produces an output quadrature-phase clock signal having an output frequency equal to one third of the input frequency.

* * * * *